United States Patent
Chern et al.

(10) Patent No.: US 6,277,719 B1
(45) Date of Patent: Aug. 21, 2001

(54) METHOD FOR FABRICATING A LOW RESISTANCE POLY-SI/METAL GATE

(75) Inventors: Jin-Dong Chern, Hsinchu; Kwong-Jr Tsai, Chunghsung; Ing-Ruey Liaw; Randy C. H. Chang, both of Hsinchu, all of (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/439,364

(22) Filed: Nov. 15, 1999

(51) Int. Cl.[7] .................. H01L 21/3205; H01L 21/4763
(52) U.S. Cl. .................. 438/585; 438/591; 438/592; 438/593; 438/647; 438/649; 438/643; 438/653; 438/655; 438/657; 438/644
(58) Field of Search .................... 438/585, 591, 438/592, 593, 647, 649, 643, 653, 655, 657, 644

(56) References Cited

U.S. PATENT DOCUMENTS

| | | | |
|---|---|---|---|
| 4,561,907 | * 12/1985 | Raicu | 148/1.5 |
| 5,103,272 | * 4/1992 | Nishiyama | 357/23.4 |
| 5,350,698 | * 9/1994 | Huang et al. | 437/26 |
| 5,384,285 | 1/1995 | Sitaram et al. | 437/200 |
| 5,441,904 | * 8/1995 | Kim et al. | 437/40 |
| 5,550,079 | 8/1996 | Lin | 437/56 |
| 5,593,924 | 1/1997 | Apte et al. | 437/200 |
| 5,668,065 | 9/1997 | Lin | 438/303 |
| 6,017,808 | * 1/2000 | Wang et al. | 438/528 |
| 6,147,388 | * 11/2000 | Ma et al. | 257/412 |
| 6,198,144 | * 3/2001 | Pan et al. | 257/412 |

* cited by examiner

Primary Examiner—John F. Niebling
Assistant Examiner—David A Zarneke
(74) Attorney, Agent, or Firm—George O. Saile; Stephen B. Ackerman; William J. Stoffel

(57) ABSTRACT

A method for forming a low resistance metal/polysilicon gate for use in CMOS devices comprising: (1) a novel anneal step prior to formation of a diffusion barrier layer and (2) a novel diffusion barrier layer composed of titanium nitride deposited over titanium silicide or titanium nitride deposited directly on the polysilicon. A first insulating layer is formed over a silicon substrate, and a polysilicon layer is formed over the first insulating layer. In a key step, the polysilicon layer is annealed to prevent peeling of the subsequently formed diffusion barrier layer. A diffusion barrier layer comprising titanium nitride deposited over titanium silicide or titanium nitride deposited directly on the polysilicon is formed over the polysilicon layer. A tungsten layer is formed over the diffusion barrier layer, and a capping layer comprising a silicon nitride layer over an oxide layer can be formed over the tungsten layer. The capping layer, the tungsten layer, the diffusion barrier layer, and the first insulating layer are patterned, thereby defining a gate structure.

19 Claims, 2 Drawing Sheets

METHOD FOR FABRICATING A LOW RESISTANCE POLY-SI/METAL GATE

BACKGROUND OF INVENTION

1) Field of the Invention

This invention relates generally to fabrication of semiconductor devices and more particularly to the fabrication of a low resistance poly-Si/metal gate structure for MOS applications.

2) Description of the Prior Art

As MOS dimensions are reduced, the contact resistance and sheet resistance increase. In conventional gate electrodes using polysilicon/silicide, such as Poly-Si/WSi$_x$, the increased resistance causes a large gate RC delay, thereby degrading performance. This is particularly detrimental in high speed memory chip and logic device applications.

One approach to overcoming the problems caused by high gate resistance in Poly-Si/silicide gate electrodes is disclosed by Sitaram (5,384,285). Resistance in a Poly-Si/Silicide gate electrode can be reduced by preventing detrimental transition-metal reactions during processing, particularly with oxygen. Sitaram prevents reactions with the transition-metal layer by forming a boron nitride or boron oxynitride capping layer over the transition metal layer. The capping layer is removed after formation of the silicide. While this approach lowers the sheet resistance of the silicide layer, it does not achieve the low contact resistance or overall gate electrode resistance of the composite poly-Si/tungsten gate electrode of the present invention. Nor does it provide the thermal stability of the present invention.

Similarly, Apte et al. (5,593,924) disclose the use of a removable capping layer composed of a metal such as titanium nitride to reduce contamination in a silicide layer; thereby lowering sheet resistance. Again, this invention does not address the other problems associated with Poly-Si/silicide gate electrodes described previously.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,384,285 (Sitaram et al.) and U.S. Pat. No. 5,593,924 (Apte) described above, as well as, the following US Patents.

U.S. Pat. No. 5,103,272 (Nishiyama) shows a process for forming titanium silicide contacts on a polysilicon gate and source and drain regions using a titanium nitride barrier layer to prevent the titanium silicide layer from agglomerating.

U.S. Pat. No. 5,550,079 (Lin) shows a silicide shunt with a tungsten nitride barrier layer.

U.S. Pat. No. 5,668,065 (Lin) shows a polysilicon/tungsten silicide/silicon nitride gate structure.

SUMMARY OF THE INVENTION

It is an object of the present invention to provide a method for fabricating a gate for MOS applications which minimizes RC delay by reducing the sheet resistance and contact resistivity of the gate.

It is another object of the present invention to fabricate a composite metal/polysilicon gate structure having good thermal stability over a wide temperature range.

It is another object of the present invention to provide a method for forming a diffusion barrier layer over a polysilicon layer that is not susceptible to peeling.

It is yet another object of the present invention to provide an economical and robust process for manufacturing a low resistance metal/polysilicon gate for use in MOS devices.

To accomplish the above objectives, the present invention provides a method for fabricating a composite metal/polysilicon gate with (1) a novel anneal step prior to formation of a diffusion barrier layer and (2) a novel diffusion barrier layer composed of titanium nitride deposited over titanium silicide or titanium nitride deposited directly on the polysilicon. The process begins by forming a first insulating layer over a silicon substrate. A polysilicon layer is formed over the first insulating layer. In a key step, the polysilicon layer is annealed to prevent peeling of the subsequently formed diffusion barrier layer. A diffusion barrier layer comprising titanium nitride deposited over titanium silicide or titanium nitride deposited directly on the polysilicon is formed over the polysilicon layer. A tungsten layer is formed over the diffusion barrier layer, and a capping layer comprising a silicon nitride layer over an oxide layer can be formed over the tungsten layer. The capping layer, the tungsten layer, the diffusion barrier layer, and the first insulating layer are patterned, thereby defining a gate structure. The basic steps in the present invention are shown in Table 1.

TABLE 1

| FIRST EMBODIMENT | SECOND EMBODIMENT |
| --- | --- |
| oxide deposition | oxide deposition |
| polysilicon deposition | polysilicon deposition |
| anneal (anti-peeling) | anneal (anti-peeling) |
| titanium deposition | titanium nitride deposition |
| anneal to form TiSi$_x$ | tungsten deposition |
| titanium nitride deposition | gate patterning |
| tungsten deposition | |
| gate patterning | |

The present invention provides considerable improvement over the prior art in terms of sheet resistance and contact resistivity, and consequently in terms of RC delay, allowing faster devices. While conventional gates have a sheet resistance of about 2.5 Ohm/□ and a contact resistivity of about 1E-3 Ohm·cm$^2$, a gate fabricated according to the present invention provides a sheet resistance of about 1.6 Ohm/□ and a contact resistivity of about 2E-7 Ohm·cm$^2$.

Also, a gate formed according to the present invention has been demonstrated to have a lower susceptibility to peeling of the diffusion barrier layer, and improved thermal stability compared to conventional gates.

The present invention achieves these benefits in the context of known process technology. However, a further understanding of the nature and advantages of the present invention may be realized by reference to the latter portions of the specification and attached drawings. Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method of forming a low resistance metal/polysilicon gate for use in CMOS devices.

Figure 1:
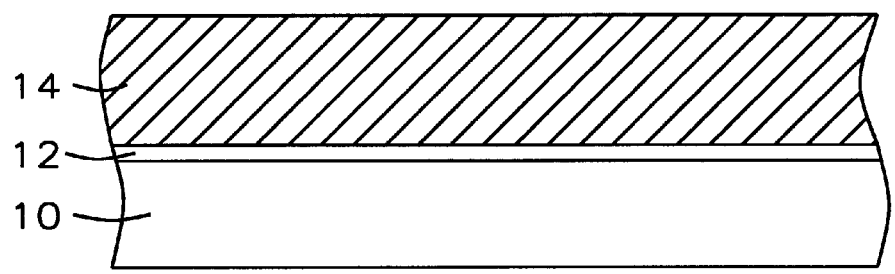
FIGS. 1, 2A, 2B, 3 and 4 illustrate sequential sectional views of a process for fabrication of a low resistance metal/polysilicon gate structure for CMOS applications.

Referring to FIG. 1, the process begins by forming a first insulating layer (12) over a silicon substrate (10). The first insulating layer (12) is preferably composed of silicon oxide ($SiO_2$) having a thickness in a range between about 50 Angstroms and 150 Angstroms with a target thickness of 100 Å. The first insulating layer can be formed using a chemical vapor deposition process (CVD) or preferably using a thermal oxidation as is well known in the art.

Still referring to FIG. 1, a polysilicon layer (14) is formed on the first insulating layer (12). The polysilicon layer (14) is preferably formed by LPCVD, at a temperature between about 600° C. and 800° C. to a thickness in a range between about 500 Angstroms and 1500 Angstroms.

In a key step, the polysilicon layer (14) is then annealed in a nitrogen atmosphere at a temperature in the range between about 800° C. and 950° C. for a time in the range between about 20 minutes and 120 minutes to form an annealed polysilicon layer (14A). Performing the polysilicon annealing step prior to forming a diffusion barrier layer has been experimentally proven to reduce the subsequently formed diffusion barrier layer's susceptibility to peeling.

First Embodiment

Figure 2A:
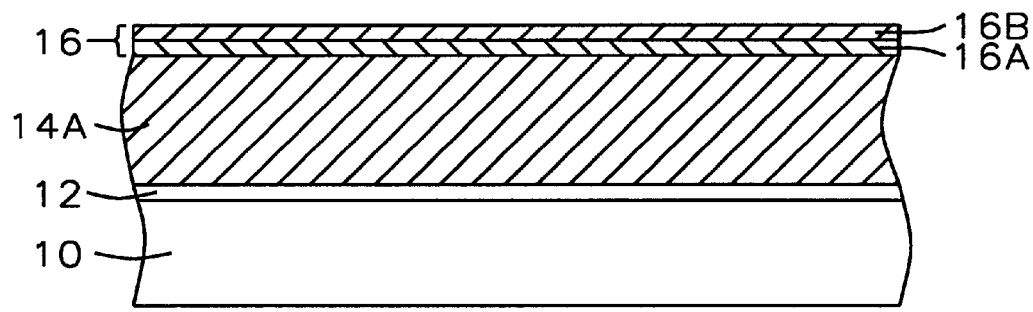

In the first embodiment, a titanium silicide layer is formed on the annealed polysilicon layer, followed by formation of a titanium nitride layer, forming a barrier layer. Referring to FIG. 2A, a titanium silicide layer (16A) is formed on the annealed polysilicon layer (14A) using a salicide process. Surfaces are cleaned using a hydrofluoric acid treatment. Titanium is deposited to a thickness in a range between about 30 Angstroms and 60 Angstroms using a sputtering process or a chemical vapor deposition (CVD) process. The sputtered titanium is caused to react with exposed polysilicon using a rapid thermal anneal (RTA) process at a temperature between about 550° C. and 700° C., for a period of time in the range between about 30 seconds and 120 seconds. The CVD titanium is deposited at a temperature of between about 550° C. and 700° C., by reacting titanium chloride ($TiCl_4$) and hydrogen (H), thus forming titanium silicide in-situ. A second annealing step is performed in a nitrogen atmosphere at a temperature of between about 700° C. and 800° C. to stabilize the titanium silicide layer (16A). Then, a titanium nitride layer (16B) is deposited on the titanium silicide layer (16A) to a thickness of between about 200 Angstroms and 400 Angstroms using a sputtering process or a CVD process. The barrier layer (16) according to the first embodiment of the present invention comprises the titanium silicide layer (16A) and the titanium nitride layer (16B).

Figure 3:
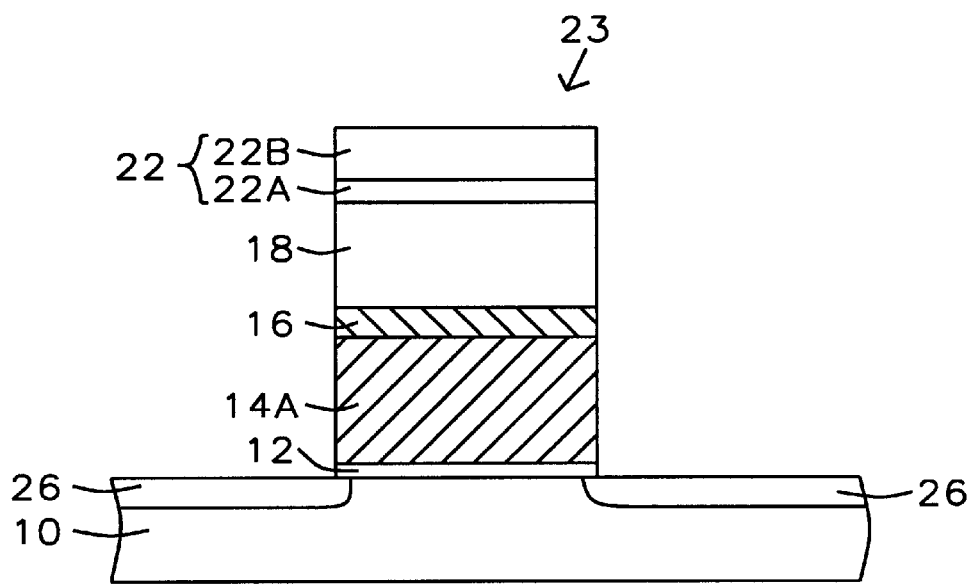

Referring to FIG. 3, a tungsten layer (18) is formed over the diffusion barrier layer (16) to a thickness in the range between about 500 Angstroms and 1500 Angstroms, preferably using a CVD process. A cap layer (22) is preferably formed over the tungsten layer (18). The cap layer can be comprised of a tetraethylorthosilicate oxide (TEOS) layer (22A) having a thickness of between about 200 Angstroms and 300 Angstroms with an overlying silicon nitride layer (22B) having a thickness of between about 1000 Angstroms and 2500 Angstroms. The cap layer (22), the tungsten layer (18), the diffusion barrier layer (16) and the polysilicon layer (14) are patterned to define a gate structure (23) having sidewalls. The patterning is preferably performed using conventional photolithography and a reactive ion etch (REI), with a chlorinated gas such as chloride ($Cl_2$ and a fluorinated gas such as carbon tetrafluoride ($CF_4$) as the source gasses. Then, the first insulating layer is removed adjacent to the gate structure by reactive plasma etching using $CHF_3$ or $CF_4+H_2$ as the source gas.

Still referring to FIG. 3, lightly doped source/drain regions (LDD) (26) are formed by ion implantation. The implant ions are preferably phosphorous or arsenic or boron, implanted at an energy in a range between about 20 KeV and 50 KeV, at a dose in a range between about 5E12 atoms/cm$^2$ and 5E13 atoms/cm$^2$.

Figure 4:
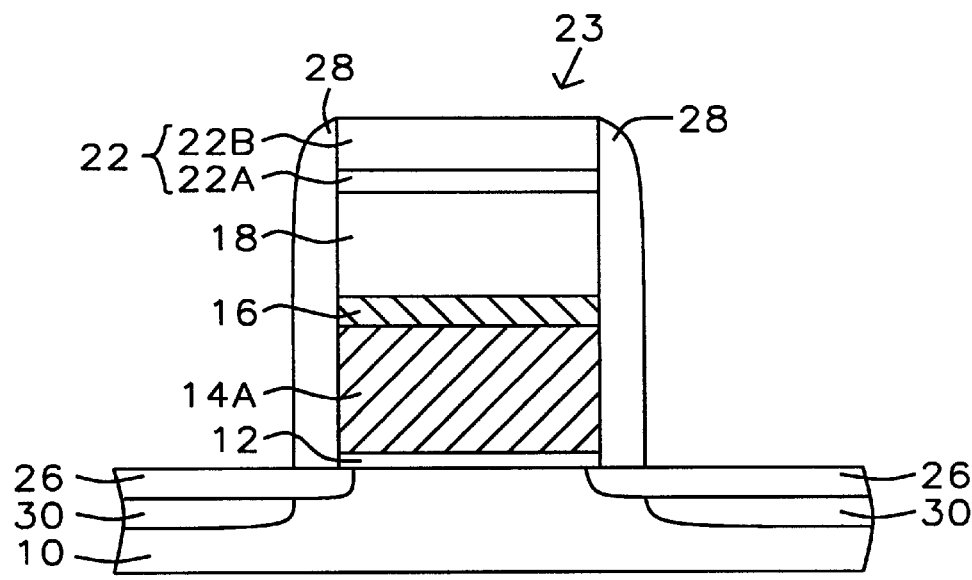

Referring to FIG. 4, spacers (28) are formed on the sidewalls of the gate structure (21). The spacers are preferably composed of silicon oxide at a thickness in a range between 500 Angstroms and 1000 Angstroms. The spacers can be formed using a LPCVD process or preferably using a plasma enhanced chemical vapor deposition (PECVD) process at a temperature between about 300° C. and 800° C., followed by an anisotropic reactive ion etch (REI) selective to silicon oxide over polysilicon, such as $CHF_3$ or $CF_4-O_2$.

Source/Drain regions (30) are formed adjacent to the spacers (28) by ion implantation. The implant ions are preferably phosphorous or arsenic, and most preferably phosphorous implanted at an energy in a range between about 30 KeV and 60 KeV, at a dose in a range between about 1E15 atoms/cm$^2$ and 1E16 atoms/cm$^2$.

Second Embodiment

Figure 2B:
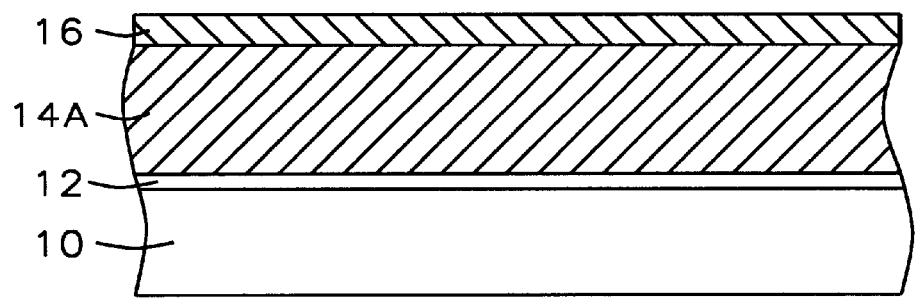

Referring to FIG. 2B, the titanium nitride layer (16) can alternatively be deposited on the annealed polysilicon layer (14A), without the deposition of titanium. As with the first embodiment, the process begins by forming a first insulating layer (12) over a silicon substrate (10) then forming a polysilicon layer (14) over the first insulating layer (12). The polysilicon layer (14) is annealed in a nitrogen atmosphere at a temperature in the range between about 800° C. and 950° C. for a time in the range between about 20 minutes and 120 minutes to form an annealed polysilicon layer (14A), reducing the susceptibility of the barrier layer (16) to peeling.

In the second embodiment, a titanium nitride layer (16B) is deposited on the annealed polysilicon layer (14A) using a sputtering process or a CVD process. The titanium nitride layer (16B) is deposited on the titanium silicide layer (16A) to a thickness of between about 200 Angstroms and 400 Angstroms. In the second embodiment of the present invention, The barrier layer (16) is only comprised of the titanium nitride layer (16B).

The second embodiment continues in a manner similar to the first, with a tungsten layer (18) formed on the barrier layer (16), a cap layer formed on the tungsten layer (18), and gate formation.

While the invention has been particularly shown and described with reference to the preferred embodiments thereof, it will be understood by those skilled in the art that various changes in form and details may be made without departing from the spirit and scope of the invention. For example, while an N-type device is illustrated, it will be understood by those skilled in the art that a P-type device can be made by using a different implant species. Also, while a gate structure is illustrated, the present invention can be used to form other conductive lines such as a word line.

What is claimed is:

1. A method for fabricating a low resistance metal gate structure comprising the steps of:
    a) forming a first insulating layer over a silicon substrate;
    b) forming a polysilicon layer over said first insulating layer;
    c) annealing said polysilicon layer to form an annealed polysilicon layer;
    d) forming a diffusion barrier layer over said annealed polysilicon layer;
    e) forming a tungsten layer over said diffusion barrier layer; and
    f) patterning said tungsten layer, said diffusion barrier layer, said polysilicon layer, and said first insulating layer; thereby defining a gate structure.

2. The method of claim 1 wherein said first insulating layer is composed of silicon oxide having a thickness of between about 50 Angstroms and 150 Angstroms, and said polysilicon layer has a thickness of between about 500 Angstroms and 1500 Angstroms.

3. The method of claim 1 wherein said polysilicon layer is annealed in a nitrogen atmosphere at a temperature of between about 800° C. and 950° C. for a time in the range between about 20 minutes and 120 minutes.

4. The method of claim 2 wherein said polysilicon layer is annealed in a nitrogen atmosphere at a temperature of between about 800° C. and 950° C. for a time in the range between about 20 minutes and 120 minutes.

5. The method of claim 1 which further includes forming a cap layer over said tungsten layer and wherein said patterning step "f" further includes patterning said cap layer; said cap layer comprising an oxide layer having a thickness of between about 200 Angstroms and 300 Angstroms and an overlying silicon nitride layer having a thickness of between about 1000 Angstroms and 2500 Angstroms.

6. The method of claim 1 wherein said diffusion barrier layer is formed by depositing titanium on said annealed polysilicon layer to a thickness of between about 30 Angstroms and 60 Angstroms; forming a titanium silicide layer by reacting said titanium with said annealed silicon layer at a temperature of between about 550° C. and 700° C. for a time of between about 30 seconds and 120 seconds; and depositing a titanium nitride layer having a thickness of between about 200 Angstroms and 400 Angstroms on said titanium silicide layer.

7. The method of claim 1 wherein said diffusion barrier layer is formed by depositing a titanium nitride layer having a thickness of between about 200 Angstrroms and 400 Angstroms on said annealed polysilicon layer.

8. A method for fabricating a low resistance metal gate structure comprising the steps of:
    a) forming a first insulating layer over a silicon substrate;
    b) forming a polysilicon layer over said first insulating layer;
    c) annealing said polysilicon layer in a nitrogen atmosphere at a temperature of between about 800° C. and 950° C. for a time in the range between about 20 minutes and 120 minutes to form an annealed polysilicon layer;
    d) depositing titanium on said annealed polysilicon layer to a thickness of between about 30 Angstroms and 60 Angstroms;
    e) forming a titanium silicide layer by reacting said titanium with said annealed silicon layer at a temperature of between about 550 C and 700 C for a time of between about 30 seconds and 120 seconds;
    f) depositing a titanium nitride layer having a thickness of between about 200 Angstroms and 400 Angstroms on said titanium silicide layer; thereby forming a diffusion barrier layer comprising said titanium silicide layer and said titanium nitride layer;
    g) forming a tungsten layer over said diffusion barrier layer; and
    h) patterning said tungsten layer, said diffusion barrier layer, said polysilicon layer, and said first insulating layer; thereby defining a gate structure.

9. The method of claim 8 which further includes forming a cap layer over said tungsten layer and wherein said patterning step "f" further includes patterning said cap layer; said cap layer comprising an oxide layer having a thickness of between about 200 Angstroms and 300 Angstroms and an overlying silicon nitride layer having a thickness of between about 1000 Angstroms and 2500 Angstroms.

10. The method of claim 8 which further includes: forming lightly doped source/drain regions adjacent to said gate structure, forming spacers on said sidewalls of said gate structure, and forming source and drain regions adjacent to said spacers.

11. The method of claim 9 which further includes: forming lightly doped source/drain regions adjacent to said gate structure, forming spacers on said sidewalls of said gate structure, and forming source and drain regions adjacent to said spacers.

12. The method of claim 8 wherein said first insulating layer is composed of silicon oxide having a thickness of between about 50 Angstroms and 150 Angstroms, and said polysilicon layer (14) has a thickness of between about 500 Angstroms and 1500 Angstroms.

13. The method of claim 11 wherein said first insulating layer is composed of silicon oxide having a thickness of between about 50 Angstroms and 150 Angstroms, and said polysilicon layer (14) has a thickness of between about 500 Angstroms and 1500 Angstroms.

14. A method for fabricating a low resistance metal gate structure comprising the steps of:
    a) forming a first insulating layer over a silicon substrate;
    b) forming a polysilicon layer over said first insulating layer;
    c) annealing said polysilicon layer in a nitrogen atmosphere at a temperature of between about 800° C. and 950° C. for a time in the range between about 20 minutes and 120 minutes to form an annealed polysilicon layer;
    d) depositing a diffusion barrier layer comprising titanium nitride having a thickness of between about 200 Angstrroms and 400 Angstroms on said annealed polysilicon layer;
    e) forming a tungsten layer over said diffusion barrier layer; and f) patterning said tungsten layer, said diffusion barrier layer, said polysilicon layer, and said first insulating layer; thereby defining a gate structure.

15. The method of claim 14 which further includes forming a cap layer over said tungsten layer and wherein said patterning step "f" further includes patterning said cap layer; said cap layer comprising an oxide layer having a thickness of between about 200 Angstroms and 300 Angstroms and an overlying silicon nitride layer having a thickness of between about 1000 Angstroms and 2500 Angstroms.

16. The method of claim 14 which further includes: forming lightly doped source/drain regions adjacent to said gate structure, forming spacers on said sidewalls of said gate structure, and forming source and drain regions adjacent to said spacers.

17. The method of claim 15 which further includes: forming lightly doped source/drain regions adjacent to said gate structure, forming spacers on said sidewalls of said gate structure, and forming source and drain regions adjacent to said spacers.

18. The method of claim 14 wherein said first insulating layer is composed of silicon oxide having a thickness of between about 50 Angstroms and 150 Angstroms, and said polysilicon layer (14) has a thickness of between about 500 Angstroms and 1500 Angstroms.

19. The method of claim 17 wherein said first insulating layer is composed of silicon oxide having a thickness of between about 50 Angstroms and 150 Angstroms, and said polysilicon layer (14) has a thickness of between about 500 Angstroms and 1500 Angstroms.

* * * * *